United States Patent [19]

Henderson, Sr.

[11] 4,313,253

[45] Feb. 2, 1982

[54] METHOD OF FABRICATING A CHARGE TRANSFER CHANNEL COVERED BY A STEPPED INSULATING LAYER

[75] Inventor: Donald L. Henderson, Sr., Encinitas, Calif.

[73] Assignee: Burroughs Corporation, Detroit, Mich.

[21] Appl. No.: 113,388

[22] Filed: Jan. 18, 1980

Related U.S. Application Data

[62] Division of Ser. No. 61,755, Jul. 30, 1979, abandoned.

[51] Int. Cl.³ .................... H01L 21/223; H01L 21/26
[52] U.S. Cl. ....................................... 29/571; 29/579; 148/1.5; 148/187; 357/24; 357/41; 357/91; 365/149
[58] Field of Search ................... 29/571, 589; 148/187, 148/1.5; 357/24, 41, 91; 365/149

[56] References Cited

U.S. PATENT DOCUMENTS

| 4,112,575 | 9/1978 | Fu et al. ............................ 29/577 C |
| 4,125,933 | 11/1978 | Baldwin et al. .................. 29/577 C |
| 4,145,803 | 3/1979 | Tasch ................................... 29/571 |
| 4,164,751 | 8/1979 | Tasch ................................... 357/41 |
| 4,240,195 | 12/1980 | Clemens et al. ....................... 29/571 |
| 4,240,845 | 12/1980 | Esch et al. .......................... 29/571 X |
| 4,251,571 | 2/1981 | Garbarino et al. ............. 148/187 X |

Primary Examiner—G. Ozaki
Attorney, Agent, or Firm—Charles J. Fassbender; Kevin R. Peterson

[57] ABSTRACT

The disclosed memory cell is comprised of a charge storage region and an adjacent charge transfer channel. A deep dopant layer extends throughout the charge storage region, and a shallow dopant layer extends throughout the charge storage region plus part-way through the charge transfer channel. Overlying the charge storage region is a first conductor that is completely covered by a thick insulating layer. This thick insulating layer also extends into the charge transfer channel part-way over the shallow dopant layer. A thin insulating layer covers the remaining portion of the channel. Lying on this thin insulating layer and extending onto the thick insulating layer is a second conductor. Parasitic capacitance and catastrophic shorts between the two conductors are minimized by the thick insulating layer; charge storage capacity of the storage region is maximized by the two dopant layers lying therein; and cell length is minimized by the thick insulating layer and underlying shallow dopant layer in the charge transfer channel.

7 Claims, 12 Drawing Figures

1

METHOD OF FABRICATING A CHARGE TRANSFER CHANNEL COVERED BY A STEPPED INSULATING LAYER

This is a division of application Ser. No. 061,755, filed July 30, 1979, now abandoned.

BACKGROUND OF THE INVENTION

This invention relates to semiconductor memories; and more particularly to random access dynamic storage memories. In the prior art, two basic types of random access dynamic storage memory cells exist. One of those cells is called "single level poly cell"; and the other cell is called a "double level poly cell".

A single level poly cell is comprised of a semiconductor substrate having an insulating layer on one surface thereof. Lying on this insulating layer are two spaced apart conductors. One of the conductors defines the charge storage region of the cell; whereas the other conductor defines the charge transfer channel of the cell.

The single level poly cell is relatively simple to fabricate; however, a problem with that cell is that it occupies too much chip space. This is due to the spacing that exists between the two conductors. The minimum width to which this spacing can be fabricated is limited by the minimum line width that can be produced. And using presently available photolithography technology that is suitable for mass production, this minimum line width is $3\pm\frac{1}{2}$ microns.

By comparison, a double level poly cell occupies less space; but it is more difficult to fabricate. In a typical process, the cell is fabricated by first forming an insulating layer on one surface of a semiconductor substrate. Then, a conductive layer is formed on the insulating layer. The conductive layer and insulating layer are then selectively removed in a self-aligned fashion to define a conductor over the charge storage region of the cell.

Next, a second insulating layer is grown over the entire surface of the above structure. This insulating layer grows at one rate over the bare semiconductor substrate, and at another rate (which is approximately 1.6 times faster) over the conductor in the storage region.

Then a second conductive layer is formed on the second insulating layer. This second conductive layer is subsequently patterned to cover the charge transfer channel portion of the cell and also extend into the charge storage region over the first conductive plate.

Due to the overlap between the first and second conductors, a parasitic capacitance is formed. The size of this capacitance varies inversely with the thickness of the insulating layer which separates the two conductors. Thus, it is desirable to make that insulating layer relatively thick, such as 3,000 Å–4,000 Å for example. Such a thickness would also minimize the probability of shorts occurring between the first and second conductive layers.

However by comparison, it is desirable to have the thickness of the insulating layer which underlies the conductor in the charge transfer region to be relatively thin. This will allow charge to flow more quickly through the charge transfer channel with the application of a voltage to the overlying conductor. Preferably, the thickness of the insulating layer in that region is only 300 Å–500 Å.

Unfortunately, the above described conventional fabrication process does not allow for the two desired insulating layer thicknesses to be achieved. If the insulating layer over the charge transfer channel is made to equal 400 Å, then the insulating layer which separates the two conductors will only be about 1.6 times 400 Å. This is substantially less than the desired 3,000 Å–4,000 Å. Conversely, if the insulating layer over the storage region is made to equal the desired 3,000 Å–4,000 Å, then the thickness of the insulating layer over the charge transfer channel will be too thick.

Also described in the prior art, is a particular version of the double level poly cell which has special relevance here. This particular double level poly cell is known as the "high capacity memory cell". It is described in U.S. Pat. No. 4,125,933 issued Nov. 21, 1978 to inventors Baldwin et al.

Basically, that cell incorporates a shallow dopant layer and a deep dopant layer throughout the charge storage region of the substrate to increase the capacitance per unit area of that region. Such an increase is of course desirable since it enables the size of the charge storage region to be reduced for a given amount of charge storage capacity. However, an unattractive aspect of the teachings of that patent is the manner in which the charge storage region and charge transfer channel are interconnected. In particular, that connection is made in the conventional single level poly and/or double level poly manner as described above.

Therefore, it is a primary object of this invention to provide an improved high capacity memory cell wherein the charge storage region and charge transfer channel are interconnected in a novel fashion which enables the cell to occupy minimal space and simultaneously minimize parasitic capacitance and catastrophic shorts between the conductors of the cell.

BRIEF SUMMARY OF THE INVENTION

These and other objects are accomplished in accordance with the invention by a memory cell that is comprised of a semiconductor substrate having dopant impurity atoms of a first type and having a first surface. A charge storage region and an adjacent charge transfer channel are defined in the substrate near the first surface. Lying throughout the charge storage region is a deep layer of dopant impurity atoms of a first type. Also lying throughout the charge storage region and extending therefrom into a first adjacent portion of the charge transfer channel is a shallow layer of dopant impurity atoms of a second type which is opposite to the first type.

Overlying the charge storage region on an insulating layer is a first patterned conductor. This conductor is covered by a relatively thick insulating layer of approximately 3,000 Å–4,000 Å. This insulating layer also extends from the charge storage region into a second adjacent portion of the charge transfer channel which lies within the first adjacent portion. The remaining portion of the charge transfer channel is covered by a relatively thin insulating layer of approximately 300 Å–500 Å. Lying on this thin insulating layer and extending therefrom onto the relatively thick insulating layer is a second patterned conductor.

In this structure, the thick insulating layer minimizes parasitic capacitance and shorts between the two conductors. Also, the two dopant layers in the charge storage region provide an increased charge storage capacity per unit area. Further, the shallow dopant layer in the charge transfer channel under the thick insulating layer provides a means of minimal length for transportng charge through the channel.

BRIEF DESCRIPTION OF THE DRAWINGS

Various features and advantages of the invention disclosed herein will best be understood by reference to the following Detailed Description and accompanying drawings wherein.

DETAILED DESCRIPTION

Figure 1:
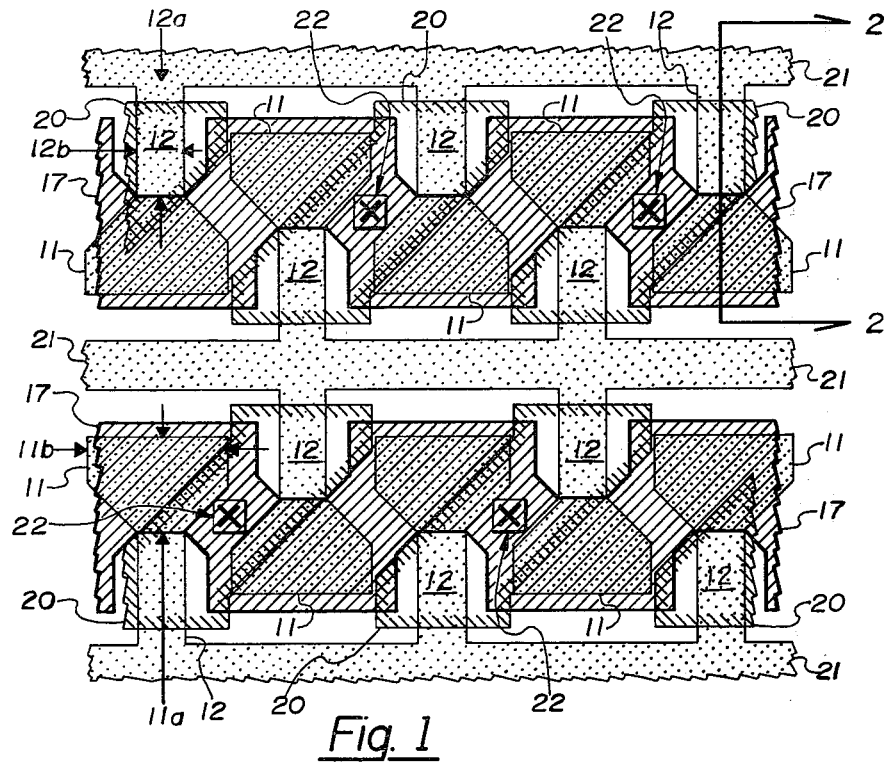
FIG. 1 is a greatly enlarged plan view of an array of memory cells which are constructed according to the invention.
Figure 2:
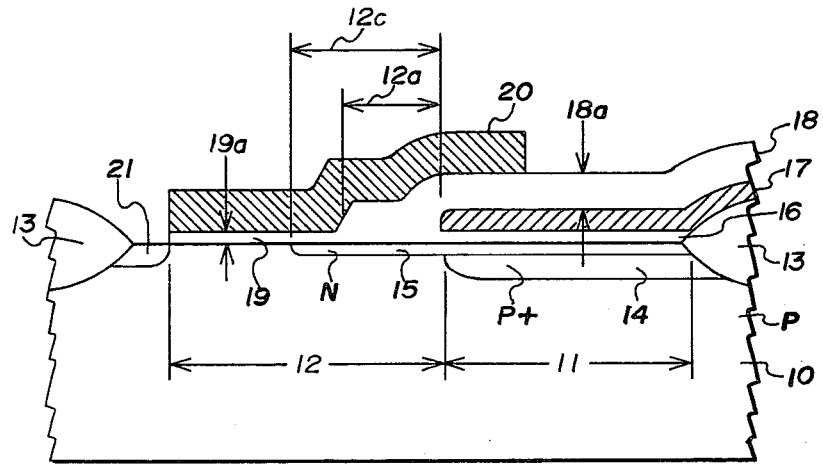
FIG. 2 is a cross-sectional view (not to scale) through one of the memory cells of FIG. 1.

Referring now to FIGS. 1 and 2, a preferred embodiment of a memory cell that is constructed according to the invention will be described. Basically, FIG. 1 illustrates a plurality of the cells in an array; whereas FIG. 2 illustrates a cross-section of one cell. In these figures, like parts are identified by like reference numerals.

Each memory cell is constructed on the surface of a semiconductor substrate 10. Substrate 10 has dopant impurity atoms of a first type which may be either P type or N type. Boron is a suitable P type dopant impurity atom; and arsenic or phosphorus are suitable N type dopant impurity atoms. Suitable concentrations for these dopant impurity atoms are $10^{14}$–$10^{15}$ atoms per cubic centimeter.

Each cell is partitioned into a charge storage region 11 and an adjacent charge transfer channel 12. The perimeter of these parts is defined by a patterned insulating layer 13. In one preferred embodiment, charge storage region 11 has a length 11A of 6 microns and a width 11B of 5 microns; whereas charge transfer channel 12 has a length 12A of 6 microns and a width 12B of 3 microns.

A deep layer 14 of dopant impurity atoms of the first type lie throughout charge storage region 11. Suitably, layer 14 is 1.0–2.0 microns deep. Also, the concentration of the impurity atoms in region 14 is substantially greater than their concentration in substrate 10. This is indicated in FIG. 2 via the P+ symbol. One particular concentration for region 14 is $10^{16}$–$10^{18}$ atoms per cubic centimeter.

Also lying throughout charge storage region 11 and extending therefrom into a first adjacent portion 12C of charge transfer channel 12 is a shallow layer of dopant impurity atoms 15. Preferably, portion 12C extends at least two microns into the charge transfer channel. The dopant atoms of layer 15 are of the second type opposite to the first type. Thus in FIG. 2, layer 15 is illustrated as being N type. Suitably, the depth of layer 15 is 0.01–0.10 microns; and the concentration of the dopant atoms is $10^{18}$–$10^{19}$ atoms per cubic centimeter.

An insulating layer 16 lies over charge storage region 11; and a first patterned conductor 17 lies on insulating layer 16. Preferably, insulating layer 16 consists of silicon dioxide; and conductor 17 consists of heavily doped polysilicon. Suitable thicknesses of this silicon dioxide and polysilicon respectively are 300 Å–500 Å and 0.3–0.5 microns.

A relatively thick insulating layer 18 lies over conductor 17 and also extends therefrom into a second adjacent portion 12A of the charge transfer channel. Portion 12A lies within Portion 12C. Preferably, it extends only $1 \pm \frac{1}{2}$ micron into the charge transfer channel. This allows for a mask alignment tolerance of $\pm \frac{1}{2}$ micron. It also allows for insulating layer 18 to fully encapsulate conductor 17 by at least 0.5 micron.

A relatively thin insulating layer 19 lies over that portion of the charge transfer channel 12 which is not covered by insulating layer 18. Preferably, layer 18 should be at least three times as thick as layer 19. In one embodiment, layer 19 has a thickness 19 A of only 300 Å–500 Å; whereas layer 18 has a thickness of 18 A of 3,000 Å–4,000 Å.

A second patterned conductor 20 lies on insulating layer 19, and extends therefrom onto insulating layer 18. Suitably, conductor 20 also consists of heavily doped polysilicon. During a read operation, a voltage is applied to conductor 20 to transfer charge from storage region 11 through charge transfer channel 12 to a bit line which is conventionally doped opposite to the substrate 21. Similarly, during a write operation, a voltage is applied to conductor 20 to transfer charge from bit line 21 through charge transfer channel 12 into storage region 11.

One important feature of the disclosed memory cell is that due to the thickness of insulating layer 18, parasitic capacitance between conductors 17 and 20 is minimized. Thus, the speed at which a voltage can be applied to conductor 20 and removed therefrom during a read or a write operation is increased. This of course is desirable since it shortens the read time and write time of the memory cell.

Another important feature of the disclosed memory cell is that due to the total encapsulation of conductor 17 by insulating layer 18, the possibility of shorts occurring between conductors 17 and 20 is substantially eliminated. This is also desirable since such shorts result in a catastrophic failure and reduce chip yield.

Additionally, in the disclosed memory cell, both of the above features are achieved in a minimal amount of chip space. For example, the minimal dimensions of portion 12A which separates the two conductors, is limited only by the alignment tolerance of a mask. By comparison, in a "single poly cell" the minimal separation of the two conductors is limited by the minimal line width that can be defined. Thus on an average, the disclosed cell of FIG. 2 is 2 microns shorter than a conventional single level poly cell.

Also, the disclosed cell is no longer than a conventional "double poly cell". This is because the shallow dopant layer in region 12C and the thick insulating layer in region 12D can both be formed without any increase in the overall strength 12A of channel 12. How this is achieved is explained in the remaining portion of this description.

Referring now to FIGS. 3A–3E, one preferred process for fabricating the cell of FIG. 2 will be described. To begin, the perimeter of charge storage region 11 and charge transfer channel 12 are defined by forming the field oxide 13. Subsequently, a thin insulating layer, from which layer 16 will be patterned, is formed over the entire surface of the cell. Preferably, this insulating layer consists of $SiO_2$ and is formed by thermal oxidation in a dry furnace.

Following this step, layers 14 and 15 of the dopant impurity atoms are formed. Either one of these layers may be formed before the other one. Both of them are formed by ion implantation through the above described insulating layer. The depth of the implant is determined by the mass of the ions and the energy level to which they are raised. For example, region 14 may suitably be formed at a depth of 1.0–2.0 microns by implanting boron atoms at 425 KEV; and region 15 may suitably be formed of a depth of 0.01–0.05 microns by imlanting arsenic atoms at 180 KEV.

Figure 3A:
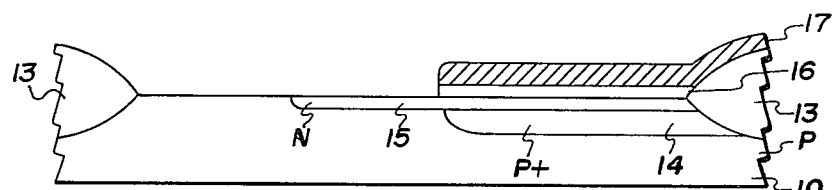
FIGS. 3A–3E illustrate the steps of one preferred process for fabricating the memory cell of FIG. 2.
Figure 3B:
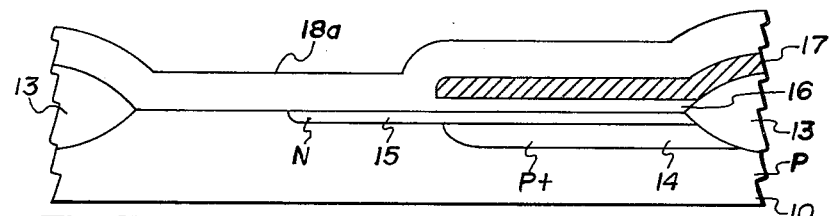

Subsequently, a layer of polysilicon is formed over the insulating layer. Then, portions of this polysilicon layer and insulating layer are removed by suitable etchants to form the first patterned conductor 17 on insulating layer 16. After these steps have been performed, the cell is as illustrated in FIG. 3A.

Next, steps are taken to fully encapsulate conductor layer 17 with the thick insulating layer. To that end, a layer of silicon dioxide 18A is formed over the entire surface of the FIG. 3A structure. Layer 18A may be formed by thermal oxidation in a wet furnace at a 1,000 C. for five hours. This will make layer 18A approximately 3,000 Å–4,000 Å thick.

Figure 3C:
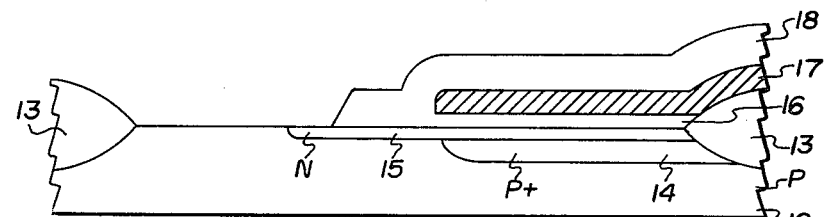

Thereafter, a portion of layer 18A is removed to form the patterned insulating layer 18 of FIG. 3C. This removal is performed by masking layer 18A; and by etching the unmasked portion with a dilute solution of HF and NH$_4$F. The result of these steps is illustrated in FIG. 3C.

Note that the alignment of the masks which define layer 18 and implant 15 are relatively uncritical. Implant 15 need only extend beyond layer 18, while at the same time stay far enough away from bit line 21 to prevent punch through. However, the entire length 12A of the charge transfer channel is about 6 microns. This overall length is dictated by the length 11A of the storage regions of the cells in an array, as illustrated in FIG. 1. Thus, the separation between bit line 21 and the shallow dopant layer 15 can readily be made to exceed 2.5 microns without increasing the overall length of the channel.

Figure 3D:
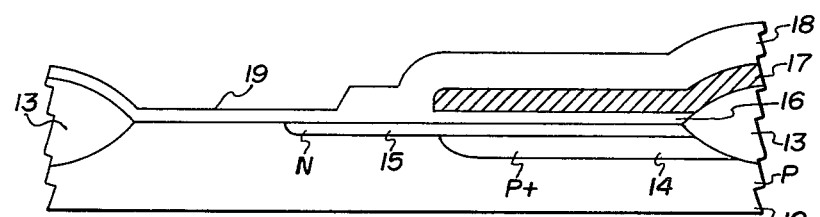

Subsequently, the relatively thin insulating layer 19 is formed over the exposed portion of charge transfer channel 12. This is illustrated in FIG. 3D. Suitably, layer 19 is formed by thermal oxidation of the entire surface of the FIG. 3C structure in a dry furnace at 1,000 C. for approximately 3 hours. This will make layer 19 about 300 Å–500 Å thick.

Figure 3E:
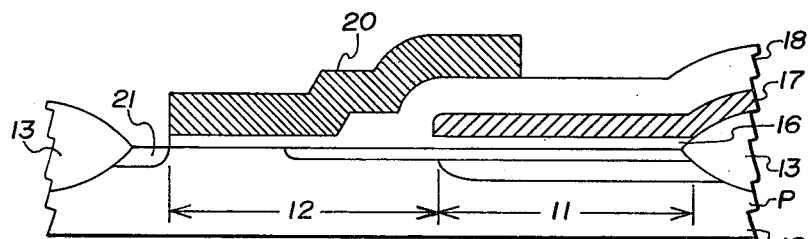

Next, conductor 20 and bit line 21 are formed as illustrated in FIG. 3E. Suitably, layer 20 consists of heavily doped polysilicon or aluminum which is deposited and patterned by conventional techniques. Conductor 20 and field oxide region 13 then act as self-aligned masks for the formation of bit line 21.

Subsequently, the entire surface of the FIG. 3E structure is covered with an insulator such as silicon dioxide (not shown). Then, conductor 20 is selectively connected to a word line which lies on that insulating layer but protrudes through contact holes 22 as was illustrated in FIG. 1.

Referring now to FIGS. 4A–4E, a second process for fabricating the disclosed memory cell will be described. The cell is illustrated in an initial stage of this process in FIG. 4A. All of the various regions there shown are constructed in the same manner as was previously described in conjunction with FIG. 3A.

A distinguishing feature of this second process is that the thick insulating layer 18 is selectively grown on only those portions of the cell where it is to remain, as opposed to being grown in a continuous layer over the entire cell and then selectively removed. To that end, a patterned Si$_3$N$_4$ layer 30 is formed as a mask for the thick insulating layer 18. This is illustrated in FIG. 4B. Preferably, mask 30 lies on insulating layer 16A from which the patterned insulator 16 is formed.

Figure 4A:
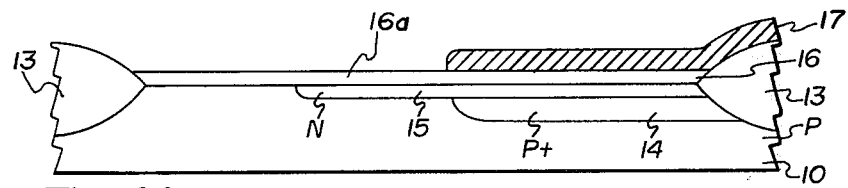
FIGS. 4A–4E illustrate the steps of another preferred process for fabricating the memory cell of FIG. 2.
Figure 4B:
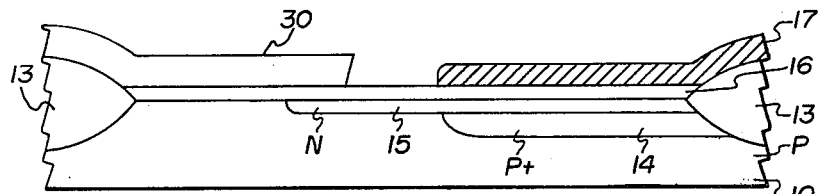

One method for forming mask 30 is to deposit a Si$_3$N$_4$ layer of about 2,000 Å thickness over the entire surface of the FIG. 4A structure. Subsequently, this layer is masked with a patterned layer of photoresist. The resulting structure is placed in a fluoride ion plasma reactor to remove those regions of the Si$_3$N$_4$ layer which are not covered by resist.

Figure 4C:
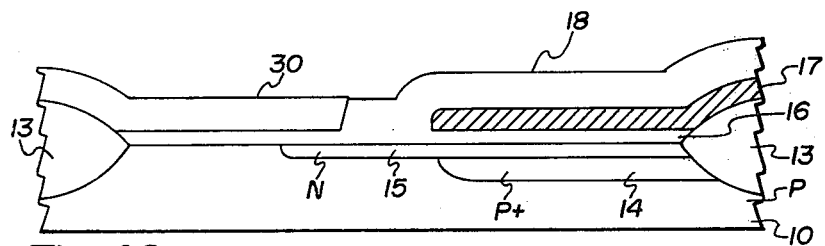

Following the formation of mask 30, insulating layer 18 is formed on those areas which are not covered by the mask. This is done by thermally oxidizing the structure of FIG. 4B in a wet furnace at 1,000 C. for 5 hours. FIG. 4C illustrates the resulting structure.

Figure 4D:
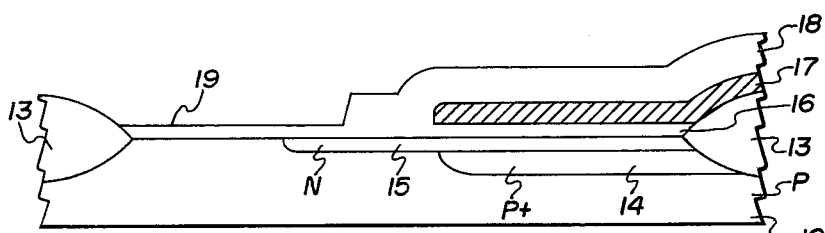
Figure 4E:
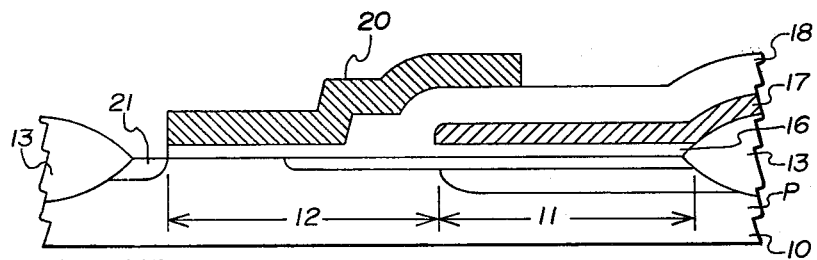

Subsequently, mask 30 is removed by placing the FIG. 4C structure in a bath of phosphoric acid. Then, the insulating layer which underlied mask 30 is removed and regrown as insulating layer 19. The result of these steps is illustrated in FIG. 4D. All of the remaining steps are then carried out in the same fashion as was previously described in conjunction with FIG. 3E.

Various preferred embodiments of a memory call that is constructed according to the invention, as well as methods of fabricating that cell, have now been described. In addition, many changes and modifications can be made to these details without departing from the nature and spirit of the invention. Thus it is to be understood that the invention is not limited to said details but as defined by the appended claims.

What is claimed is:

1. A method of fabricating a memory cell on a semiconductor substrate comprised of dopant impurity atoms of a first type and having a first surface, including the steps of:

defining a charge storage region and an adjacent charge transfer channel in said substrate near said first surface;

introducing a deep layer of dopant impurity atoms of said first type throughout said charge storage region;

introducing a shallow layer of dopant impurity atoms of a second type opposite to said first type throughout said charge storage region and also extending therefrom into a first adjacent portion of said charge transfer channel;

forming a relatively thin insulating layer over said charge storage region;

forming a first patterned conductor on said relatively thin insulating layer over said charge storage region;

forming a relatively thick insulating layer over said first patterned conductor, and also extending therefrom over a second adjacent portion of said charge transfer channel that lies within said first adjacent portion so that said shallow layer of dopant impurity atoms lies under and extends beyond said relatively thick insulating layer in said charge transfer channel;

forming a relatively thin insulating layer over that portion of said charge transfer channel which is not covered by said relatively thick insulating layer; and forming a second patterned conductor on said relatively thin insulating layer over said charge transfer channel and extending onto said relatively thick insulating layer.

2. A method according to claim 1 wherein said relatively thick insulating layer is formed by the substeps of:
covering both said charge storage region and said charge transfer channel with said relatively thick insulating layer; and
subsequently removing said relatively thick insulating layer from that portion of said charge transfer channel which lies outside of said second adjacent portion.

3. A method according to claim 1 wherein said relatively thick insulating layer is formed by the substeps of:
covering that portion of said charge transfer channel which lies outside of said second adjacent portion with a masking material; and subsequently forming said relatively thick insulating layer on only those surfaces of said memory cell which are not covered by said masking material.

4. A method according to claim 1 wherein said first adjacent portion of said charge transfer channel is greater than 1.5 microns in length.

5. A method according to claim 1 wherein said relatively thick insulating layer is at least three times thicker than said relatively thin insulating layer.

6. A method according to claim 1 wherein sid first type dopant impurity atoms are P-type and said second type dopant impurity atoms are N-type.

7. A method according to claim 1 wherein said first type dopant impurity atoms are N-type and said second type dopant impurity atoms are P-type.

* * * * *